(12) United States Patent
Frosien et al.

(10) Patent No.: US 7,838,830 B2
(45) Date of Patent: Nov. 23, 2010

(54) CHARGED PARTICLE BEAM APPARATUS AND METHOD FOR OPERATING A CHARGED PARTICLE BEAM APPARATUS

(75) Inventors: Juergen Frosien, Riemerling (DE); Helmut Banzhof, Poing (DE); Jacob Levin, Rehovot (IL); Dror Shemesh, Hod-Hasharon (IL)

(73) Assignee: ICT, Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 463 days.

(21) Appl. No.: 11/923,407

(22) Filed: Oct. 24, 2007

(65) Prior Publication Data
US 2008/0258060 A1 Oct. 23, 2008

(30) Foreign Application Priority Data
Oct. 25, 2006 (EP) .................................. 06022329

(51) Int. Cl.
*G01N 23/00* (2006.01)
(52) U.S. Cl. .................... 250/310; 250/398; 250/306
(58) Field of Classification Search .............. 250/310
See application file for complete search history.

(56) References Cited

U.S. PATENT DOCUMENTS

| | | | | |
|---|---|---|---|---|
| 4,634,871 A | * | 1/1987 | Knauer | 250/398 |
| 5,894,124 A | | 4/1999 | Iwabuchi et al. | |
| 6,497,194 B1 | | 12/2002 | Libby et al. | |
| 6,534,766 B2 | * | 3/2003 | Abe et al. | 250/307 |
| 6,627,903 B1 | * | 9/2003 | Hirayanagi | 250/491.1 |
| 6,667,476 B2 | * | 12/2003 | Todokoro et al. | 850/9 |
| 7,135,676 B2 | * | 11/2006 | Nakasuji et al. | 250/310 |
| 7,209,055 B1 | * | 4/2007 | Stovall et al. | 341/14 |
| 7,683,319 B2 | * | 3/2010 | Makino et al. | 250/310 |
| 2002/0079463 A1 | | 6/2002 | Shichi et al. | |
| 2003/0010913 A1 | | 1/2003 | Essers | |
| 2003/0209667 A1 | | 11/2003 | Petrov et al. | |

FOREIGN PATENT DOCUMENTS

| | | |
|---|---|---|
| EP | 0810629 A1 | 12/1997 |
| WO | WO-01/45136 A1 | 6/2001 |

OTHER PUBLICATIONS

Extended European Search Report dated Sep. 25, 2007.

* cited by examiner

*Primary Examiner*—David A. Vanore
*Assistant Examiner*—Phillip A. Johnston
(74) *Attorney, Agent, or Firm*—Patterson & Sheridan, LLP (57) ABSTRACT

A charged particle beam apparatus is provided, which comprises a charged particle beam column for generating a primary charged particle beam; a focusing assembly, such as a charged particle lens, e.g., an electrostatic lens, for focusing the primary charged particle beam on a specimen; a detector for detecting charged signal particles which are emerging from the specimen; and a deflector arrangement for deflecting the primary charged particle beam. The deflector arrangement is arranged downstream of the focusing assembly and is adapted for allowing the charged signal particles passing therethrough. The detector is laterally displaced with respect to the optical axis in a deflection direction defined by the post-focusing deflector arrangement.

24 Claims, 6 Drawing Sheets

——— Primary ions (PI), ----- Secondary electrons (SE), ——— Secondary ions (SI)

——— Primary ions (PI), ----- Secondary electrons (SE), ——— Secondary ions (SI)

CHARGED PARTICLE BEAM APPARATUS AND METHOD FOR OPERATING A CHARGED PARTICLE BEAM APPARATUS

CROSS-REFERENCE TO RELATED APPLICATIONS

This application claims priority to European Patent Application No. 06022329.4, filed Oct. 25, 2006, which is herein incorporated by reference.

The invention relates to improvements in the field of charged particle beam apparatuses and pertains particularly to a charged particle beam apparatus which includes a deflection arrangement, and to a method for operating a charged particle beam apparatus.

BACKGROUND OF THE INVENTION

In focused ion beam systems of the art, an ion beam is emitted from a source, accelerated, and focused into a small probe by ion optical lenses. The probe is scanned across a specimen by a deflector system. Such focused ion beam systems are used, for example, for imaging the specimen surface or for removing specimen material by sputtering. In this way, structures on the scale from several hundred microns down to a few hundred nanometers can be generated on the specimen.

Similarly, electron beam devices allow examining and/or manipulating of a specimen. For this purpose, electron beam apparatuses are known in the art, e.g., for electron microscopy. Such electron beam apparatuses include scanning electron microscopes, scanning transmission electron microscopes and the like.

The emitted charged particle beam, also known as the primary charged particle beam, can be tilted or deflected.

When the focused primary charged particle beam impinges on the specimen surface, the primary charged particles interact with the specimen and are either scattered or backscattered or generate secondary charged particles which originate from the specimen. For the purpose of this description any charged particles emerging after an interaction of the primary charged particle beam with the specimen are referred to as charged signal particles. Because the charged signal particles are generated upon interaction of the primary charged particles with the specimen, the charged signal particles transmit information about the specimen. For example, charged signal particles are primary charged particles which are backscattered from or transmitted through and scattered by the specimen. Moreover, so-called secondary charged particles, which are generated upon interaction of the primary charged particles with the specimen, are also referred to as charged signal particles. Secondary charged particles are for instance secondary electrons.

The charged signal particles are detected by appropriate particle detectors such as scintillators or the like to generate a detection signal. The detection signal can be used for various purposes. If, for example, the primary beam is used for manipulating the specimen, e.g., in ion milling applications, the detected charged signal particles allow for obtaining an image and/or a feedback signal for the manipulation process. In the case of scanning microscopy, a scanning image of the specimen is generated from the detection signal.

Charged particle apparatuses known in the art are described, for example, in the following documents: U.S. 2002/0079463 describes a sample fabricating method of irradiating a sample with a focused ion beam at an incident angle less than 90 degrees with respect to the surface of the sample. U.S. 2003/0209667 describes a beam directing method and device for spatially separating between a primary charged particle beam and a beam of secondary particles. U.S. 2003/0010913 describes a detector for scanning electron microscopes with high pressure in the sample chamber. U.S. Pat. No. 6,497,194 describes particle beam systems that include a work stage assembly and a first particle beam source. WO 01/45136 describes a method for the examination of specimen with a beam of charged particles that provides one or more images of the specimen made with different view angles.

However, the apparatuses of the art only provide for limited control possibilities of the primary charged particle beam or of the charged signal particles.

SUMMARY OF THE INVENTION

In view of the above, there is provided a charged particle beam apparatus according to claim 1, and a method for operating the same according to claim 23. In an aspect of the invention, the charged particle beam apparatus comprises a charged particle beam source for generating a primary charged particle beam; a focusing assembly, such as a charged particle lens, e.g., an electrostatic lens, for focusing the primary charged particle beam on a specimen, and defining an optical axis; a post-focusing deflector arrangement for deflecting the focused primary charged particle beam; and a detector for detecting charged signal particles which are emerging from the specimen upon interaction of the focused primary charged particle beam with the specimen. The post-focusing deflector arrangement is arranged downstream of the focusing assembly with respect to the propagation direction of the primary charged particle beam. The post-focusing deflector is adapted for allowing the charged signal particles passing therethrough. Thereby, a propagation path of the charged signal particles for propagation from the specimen to the detector can be defined. The detector is, further, laterally displaced from the optical axis in a deflection direction defined by the post-focusing deflector arrangement. Typically, the detector is arranged in a deflection direction defined by the post-focusing deflector arrangement with respect to the charged signal particles.

In a further aspect of the invention, the charged particle beam apparatus comprises a charged particle beam source for generating a primary charged particle beam; a focusing assembly for focusing the primary charged particle beam on a specimen, the focusing assembly defining an optical axis; a post-focusing beam deflector arrangement arranged downstream of the focusing assembly with respect to the propagation direction of the primary charged particle beam; a pre-focusing beam deflector arrangement arranged upstream of the focusing assembly with respect to the propagation direction of the primary charged particle beam; and a control unit for controlling the post-focusing and the pre-focusing deflector arrangement. The control unit is adapted for controlling the pre-focusing deflector arrangement to deflect the beam in a deflection direction such that the charged particle beam traverses the focusing assembly at a tilt angle with respect to the optical axis; hence, the beam is therefore inclined with respect to the optical axis. Preferably, the charged particle beam is deflected such that it traverses the focusing assembly at or near the optical axis, i.e., the charged particle beam traverses the focusing assembly off-axis and strikes the principal plane of the focusing assembly at or near the optical axis. The distance between the optical axis and the beam at the principal plane depends for instance on the geometry of the focusing assembly and can be less than 200 µm, and typically even less than 100 µm. Further, the control unit can be adapted for controlling the post-focusing deflector arrangement to deflect the charged particle beam in a deflection direction that is opposite to the deflection direction of the pre-focusing deflector arrangement. Preferably, the control unit is adapted for controlling the pre-focusing deflector arrangement to deflect the beam such that the beam traverses the focusing assembly at or near the optical axis. Thereby, the beam may be deflected toward the optical axis.

There is further provided a method for operating a charged particle beam apparatus. In a further aspect of the invention, the method comprises the steps of providing a specimen; generating a primary charged particle beam; focusing the primary charged particle beam onto the specimen by a focusing assembly, the focusing assembly defining an optical axis; deflecting, by a post-focusing deflector arrangement, the focused primary charged particle beam; directing, by the post-focusing deflector arrangement, charged signal particles which are emerging from the specimen upon interaction of the focused primary charged particle beam with the specimen, toward a detector, whereby the charged signal particles typically pass through the deflector arrangement; and detecting, by the detector, the charged signal particles. The primary charged particle beam is deflected, by the deflector arrangement, in a region downstream of the focusing assembly with respect to the propagation direction of the primary charged particle beam.

In yet a further aspect of the invention, the method comprises the steps of providing a specimen; generating a primary charged particle beam; deflecting the beam in a first deflecting step; directing and/or focusing the deflected primary charged particle beam onto the specimen by a focusing assembly, thereby defining an optical axis; and deflecting the focused beam in a second deflecting step. In the first deflection step, the beam is deflected in a deflection direction such that the beam traverses the focusing assembly at a tilt angle with respect to the optical axis, i.e., the charged particle beam is inclined with respect to the optical axis. In the second deflection step, the beam is deflected in a deflection direction opposite to the deflection direction of the first deflection step. Preferably, the beam is deflected, in the fist deflection step, such that the beam traverses the focusing assembly at or near the optical axis, e.g., closer to the optical axis than 200 μm, and typically even closer than 100 μm. Preferably, the beam is deflected, in the second deflection step, such that the beam impinges on the specimen at or near the optical axis and at a second tilt angle with respect to the optical axis. Preferably, the beam is deflected, in the first deflection step, by a pre-focusing beam deflector arrangement arranged upstream of the focusing assembly with respect to the propagation direction of the primary charged particle beam. Further, preferably, the beam is deflected, in the second deflection step, by a post-focusing beam deflector arrangement arranged downstream of the focusing assembly with respect to the propagation direction of the primary charged particle beam.

The invention is also directed to apparatuses for carrying out the disclosed methods and including apparatus parts for performing each described method steps. These method steps may be performed by way of hardware components, a computer programmed by appropriate software, by any combination of the two or in any other manner. Furthermore, the invention is also directed to methods by which the described apparatus operates. It includes method steps for carrying out every function of the apparatus or manufacturing every part of the apparatus.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures. Therein.

DETAILED DESCRIPTION OF THE DRAWINGS

In the remainder of the description the invention is described in connection with a focused ion beam apparatus. The invention, however, is not restricted thereto and a skilled person will appreciate that the invention is also applicable to other charged particle beam apparatuses employing other charged particles such as electrons, e.g., in TEM, SEM and STEM microscopes. Further, any type of charged signal particles may be generated, for example secondary electrons or backscattered ions or electrons.

In the focused ion beam apparatus, an ion beam is emitted from a source. The ion beam is then accelerated and focused into a small spot, or probe, e.g., by ion optical lenses. In some embodiments, the probe can be scanned across the specimen by a deflector system.

In one embodiment, the ion beam is used for imaging the surface of the specimen by scanning the ion beam over the specimen surface. In other embodiments, the ion beam is used for manipulating the specimen. The ion beam allows, for example, sputtering the specimen surface, i.e., colliding energetic ions onto a specimen surface, thereby removing at least some of the atoms of the surface. In this way structures at the scale from several hundred microns down to a few hundred nanometers can be generated on the specimen. The ion beam can also be used to deposit material, e.g., in focused ion beam-assisted chemical vapor deposition.

In particular, the ion beam can be used for ion milling the surface of a specimen. Typical applications of ion milling include the preparation of cross sections e.g., for defect analysis in semiconductor processing. Ion milling may further be used for preparing TEM lamellae from bulk samples, i.e., thin specimen for transmission electron microscopy, for manufacturing microstructures such as tips for atomic force microscopy; for fine tuning of micro-scale devices like magnetic sensors for hard disk drives, for repairing defects of lithography reticles, and for similar purposes.

In the ion beam apparatus, any ion source known in the art can be used. For example, a gallium liquid metal ion source can be used. After the ions are emitted from the source, they are accelerated and directed towards the specimen, typically by one or more electrode arrangements set on a suitable potential. There are further provided focusing means or a focusing assembly for focusing the ion beam, e.g., an ion lens. Any focusing means known in the art can be used. The focusing means can be electrostatic or magnetic. Typically, an electrostatic focusing means comprising one or more electrodes is provided. If the beam is focused, spot sizes ranging from a few micrometers down to a few nanometers can be achieved. Typical ion beam spots (or probes) have a minimum diameter ranging from 1 μm or 100 nm down to 10 nm.

The focusing means define an optical axis. Typically, the optical axis is defined as a symmetry axis of the focusing means. However, even in the absence of such a symmetry axis, the optical axis can be defined e.g., by an axis, in particular by a central axis of the focusing means, or by an axis corresponding to an optical beam path having minimum aberration when traversing the focusing means. It can be desired to deflect the ion beam away from the optical axis, for example for scanning the ion beam over the specimen surface. For this purpose, some embodiments have a deflection arrangement, more specifically a pre-focusing deflection arrangement. The pre-focusing deflection arrangement, or upstream deflection arrangement is arranged upstream of the focusing means. The expressions "upstream" and "downstream" are used with respect to the propagation direction of the primary charged particle beam. The deflection arrangement is typically arranged such that the beam can be independently deflected in two orthogonal directions. The deflection arrangement of some embodiments is an electrostatic deflection arrangement. However, the deflection may alternatively be achieved using any other deflection means, e.g., a magnetic deflector. A deflection arrangement usually defines a deflection direction, which is the direction of an acceleration that deflected particles are subjected to.

In some embodiments, the deflection arrangement is a two-stage deflection arrangement. This means that the ion beam can be deflected independently at two locations along the ion beam propagation path. Thus, two independently addressable deflection units are provided. Thereby, two degrees of freedom, typically two degrees of freedom per orthogonal deflection direction, can be adjusted independently. In a first example, the primary charged particle beam can be deflected such as to traverse the focusing means at a pre-determined location and at a pre-determined tilt angle with respect to the optical axis. The pre-determined location can e.g., be substantially a center of the focusing means, i.e., usually a location at or close to the optical axis. In a second example, the position of the ion beam center (or spot or probe) in the specimen plane and the position of the ion beam center in a center of the focusing assembly or a principle plane of the focusing assembly can be adjusted independently. Thus, the presence of two independently addressable deflection units is generally different from a deflection unit allowing deflection in two orthogonal directions.

The ion beam is further deflected by a downstream or post-focusing deflection arrangement that is arranged downstream of the focusing means. Typically, the post-focusing deflection arrangement can be constructed similarly to the above-mentioned pre-focusing deflection arrangement, e.g., an electrostatic deflection arrangement. The post-focusing deflection arrangement thus typically comprises at least one electrode. The post-focusing deflection arrangement has the effect of deflecting the ion beam in the vicinity of the specimen. Preferably, the post-focusing deflection arrangement is placed as closed as possible to the specimen surface. For example, the lower end of the post-focusing deflection arrangement can have a distance to the specimen surface of about 2 mm, preferably of about 1 mm or even less. From a mechanical point of view distances down to 10 μm are easily achievable. The distance may be defined to be either along the propagation path of the beam, or normal to the specimen surface. By choosing the distance to be small, a defocusing effect e.g., due to dispersion can be kept relatively small. Further, in some embodiments the deflector arrangement can direct the charged signal particles towards the detector in the vicinity of the specimen, thus increasing detection efficiency. A small distance between the post-focusing deflection arrangement and the specimen surface of about 1 mm still allows having a voltage difference of about 1 KV which is sufficient to ensure effective deflection.

In many applications, it is desired to tilt the incident angle of the ion beam onto the specimen. Hereby, the incident angle is defined either relative to the normal of a specimen surface at the beam spot, or relative to the normal of a surface defined by the specimen, e.g., an envelope surface of the specimen surface. A tilted beam allows, for example, acquiring three-dimensional image information. Further, by tilting the beam in ion milling or similar techniques, a desired three-dimensional profile can be achieved or approximated on the specimen. For example, as it is explained in more detail in conjunction with FIG. 5, a cross section normal to the specimen surface can be obtained by appropriately tilting the incident ion beam. In particular, a device and method for substantially compensating, or for acting against, the milling slope in focused ion beam applications by an electrostatic beam tilting device is proposed. Thus, independently of the shown embodiments, there is provided a deflection arrangement for variably tilting the beam with respect to the specimen surface without large mechanical movement of the apparatus or the specimen.

In one embodiment, both a pre-focusing deflection arrangement and a post-focusing deflection arrangement are provided. This provides for a particularly flexible beam control. Consequently, it is proposed to provide individual voltage supplies for each deflector. For example, the post-focusing deflector arrangement may deflect the beam such that the beam is deflected towards the optical axis. Thereby, the beam may impinge on the specimen at a distance from the optical axis that is smaller than the beam distance in a deflection region of the post-focusing deflector arrangement.

For illustrating purposes, to obtain an inclined beam for compensating a so-called milling slope as explained later, only a post-focusing deflection arrangement would be sufficient. Alternatively, only a pre-focusing deflection arrangement could be used. However, the use of a single deflection arrangement to tilt the ion beam with respect to the optical axis would affect the beam quality by causing chromatic or other aberrations. A combination of pre-focusing and post-focusing deflector arrangements ensures that the aberrations caused by any of the post-focusing or pre-focusing deflector arrangement is reduced or minimized by a counteraction of the respective other deflector arrangement. The pre-focusing deflector arrangement therefore preferably acts in a substantially opposite manner with respect to the post-focusing deflector arrangement. Typically, the pre-focusing and the post-focusing deflector arrangement cause a deflection of the ion beam in substantially opposite directions with respect to each other.

It is, in particular, proposed to provide a beam controller that is adapted to control the deflection arrangements such that the primary charged particle beam traverses the focusing means substantially at a center of the focusing means and at a pre-focusing tilt angle with respect to the optical axis. Thereby, an aberration of the focusing means is reduced. Optionally, the control unit is further adapted for controlling the post-focusing deflector arrangement to deflect the beam substantially opposite to the pre-focusing tilt angle. Thereby, a chromatic aberration opposite to the chromatic aberration of the pre-focusing deflector is typically introduced. Thus, the chromatic aberration of the pre-focusing deflector is reduced, or even substantially compensated.

In some embodiments, the pre-focusing deflector arrangement comprises at least two independently controllable deflection units. Thereby, even more degrees of freedom can be controlled independently. For example, the ion beam can be deflected such that it traverses the focusing lens and, more specifically, a center of the focusing assembly in the vicinity of the optical axis and at a predetermined tilt angle with respect to the optical axis. While details depend on the geometry of the focusing assembly, in specific embodiments "the vicinity of the optical axis" can be defined by a distance of less than 200 µm, and typically of even less than 100 µm from the optical axis. The center of the focusing assembly can be defined as correlating to the plane where for instance the electrostatic field has a saddle point. A typical focusing assembly can be regarded as a "thick" lens. Thick lenses have—in contrast to thin lenses—two principal planes which are spaced apart from each other and between which the saddle point of the electrostatic field in case of an electrostatic focusing assembly is arranged. As an example, the focal length of a focusing assembly can be about 25 mm, and the principal planes can have a distance from each other of about 1 mm. The principal planes of the focusing lens are arranged orthogonal to the optical axis. The center of the focusing assembly can therefore be defined to be arranged between the two principal planes of the focusing assembly. Given a small distance between the two principal planes of a "thick" focusing assembly, the center of the focusing assembly can be regarded as overlapping with any of the principal planes as a good first approximation. If the focusing assembly can be regarded as a "thin" lens, then the center of the focusing assembly overlaps with the principal plane. Further, the post-focusing deflector arrangement may be controlled such that the position, at which the ion beam impinges on the specimen surface, is in the vicinity of the optical axis, or at some other predetermined location. Further, the deflector arrangements may be controlled such that the angle, at which the ion beam impinges on the specimen surface, is a predefined tilt angle. The value of the tilt angle depends on the specific application and is in the range greater than 0° and less than about 15°, preferably less than 10°. For ion milling application, an angle of about 3° as been proved to be sufficient. The beam controller is, thus, adapted to control the deflection arrangements such that the beam is tilted at least twice, whereby the beam traverses the optical axis at, in or near a principle plane of the focusing assembly or focusing lens. Thus, a beam aberration can be reduced. By providing two deflection means for tilting the beam twice, the incident beam tilt angle at the specimen surface can be adjusted independently of the location at which the beam impinges on the specimen surface, whence there is no need of readjusting the specimen when the beam tilt angle is changed.

Further, blurring and chromatic aberration of deflection and deflection coma can be reduced if the ion beam is suitably controlled by the deflector arrangements. In particular, the post-focusing deflector arrangement may deflect the ion beam back towards the optical axis, such that the spot will be formed on the sample surface close to the optical axis, i.e., at a distance of less than 100 µm, more preferably of less than 60 µm, and typically about 40 µm from the optical axis. By adjusting the deflection voltages appropriately, it is further possible to reduce or to compensate a chromatic aberration of deflection and a deflection coma.

In a further embodiment, the pre-focusing deflector arrangement is operable for scanning the charged particle beam over the specimen. For scanning, a saw-tooth voltage can be supplied to the pre-focusing deflector arrangement, or to at least a part of the pre-focusing deflector arrangement. That is, a saw-tooth voltage is supplied to at least one of the deflection units of the pre-focusing deflector arrangement. In a specific embodiment, respective saw-tooth voltages are supplied to at least two of the deflection units of the pre-focusing deflector arrangement, the saw-tooth voltages being supplied in a coordinated manner with respect to each other. Further, a first DC voltage is supplied, during the scanning, to the post-focusing deflector arrangement, e.g., for tilting the beam. Then, a further DC voltage is superimposed to the saw-tooth voltage supplied to the pre-focusing deflection arrangement. The first and the further DC voltages are correlated to each other, i.e., they are chosen as a function of each other. In particular the further DC voltage may be determined as a function of the first DC voltage. Thus, in the case of a beam tilt DC voltage, the beam tilt DC voltages are applied to the pre-focusing deflectors in addition to the saw tooth voltages for the scan.

For the purpose of this description, tilting is to be understood as generating a fixed or constant inclination of the ion beam with respect to the normal of the specimen surface or the optical axis. A constant inclination can be obtained by appropriately deflecting the ion beam with the pre-focusing or/and post-focusing deflector arrangement or by inclining the ion beam column with respect to the specimen. Alternatively, the specimen can be inclined with respect to the ion beam column. On the other hand, scanning means deflecting the ion beam variably or periodically from one direction to an opposite direction so as to cause the ion beam to be inclined periodically between opposite directions. By means of scanning the ion beam is inclined between a positive and a negative angle with respect to a notional main propagation direction of the ion beam. The notional main propagation direction defines that direction which the ion beam takes without any scanning. However, the notional main propagation direction can be changed by tilting, i.e., by adding a constant inclination. As described later in more detail, tilting and scanning can be superimposed with each other for instance by providing a constant deflection voltage (DC voltage) and a variable or periodical voltage, preferably a tooth-saw voltage, to the pre-focusing deflector arrangement. The DC voltage causes a constant inclination (tilting) while the variable or periodical voltage causes a variable or periodical deflection (scanning) of the ion beam in addition to the constant inclination. Hence, the ion beam is scanned around the tilted main direction.

In a further embodiment, the signal particles emerging from the specimen are detected by a detector. The signal particles may, for example, be secondary charged particles or backscattered primary charged particles, i.e. ions. In this embodiment, the post-focusing deflector arrangement of the charged particle apparatus comprises an electrode that is adapted for allowing the charged signal particles passing therethrough. In one specific aspect, the post-focusing deflector arrangement and/or the electrode has an opening for allowing the charged signal particles passing therethrough. Thus, the electrode can be arranged freely in the apparatus without blocking the propagation of the signal charged particles. The opening is generally arranged such that the primary charged particle beam does not pass therethrough during normal operation.

The post-focusing deflector arrangement can further be arranged for directing the charged signal particles toward the detector. This may increase the detection efficiency. It is preferred that the deflector arrangement is adapted such that during normal operation, a voltage, e.g., a DC voltage, is supplied to the deflection arrangement such that the signal particles are directed toward the detector. The DC voltage may be constant in time, or it may be varying in time, but have a constant sign.

The post-focusing deflector arrangement may define a deflection plane, i.e., a plane containing the optical axis and a general velocity, e.g., an average velocity, of the deflected charged signal particles. The detector is preferably arranged in a region intersecting the deflection plane. Optionally, the detector is arranged, relative to the optical axis, outside the deflection arrangement.

The electrode, or some part of the deflection arrangement, can be adapted for allowing the charged signal particles passing therethrough e.g., by the following means: Firstly, it may have a grid-like portion for allowing the charged signal particles passing therethrough. Thus, in an embodiment the opening of the post-focusing deflector arrangement or of the electrode is formed by a grid-like portion. Secondly, the post-focusing deflector arrangement may comprise, or the electrode may be formed by, at least two elements, preferably electrodes or electrode portions. The two elements can then define an opening therebetween for allowing the signal particles passing therethrough. Preferably, the elements are laterally separated, thereby defining the opening. More generally, the electrode may have compact portions, that are suitable for being set at a voltage, and opened portions that are suitable for letting the charged signal particles pass through. The electrode may comprise separate portions, i.e., portions that are not connected to each other. The definition of the term electrode comprises that essentially the same voltage is applied to all portions of the electrode during operation. The voltage may, however, be supplied to separate portions from separate voltage sources.

Preferably, the detector, or a center of the detector, is laterally displaced with respect to the optical axis. Then, the electrode can be arranged between the optical axis and the detector. Further, the detector is typically not arranged at or centered around the optical axis. Further, the detector is usually arranged on a downstream side of the focusing assembly with respect to the propagation direction of the primary charged particle beam. The downstream side is defined as follows: the focusing assembly defines an optical axis and at least one principle plane, and a detection portion of the detector is located on a downstream side of the focusing plane. The principle plane is typically orthogonal to the optical axis and is arranged in the vicinity of or overlaps with a center of the focusing assembly.

Generally, the charged particle beam apparatus is arranged such that during normal operation, the propagation path of the charged signal particles does not traverse the focusing assembly.

In some embodiments, the DC voltage supplied to the electrode of the (downstream) deflector has the double effect of directing the charged signal particles toward the detector and of deflecting the focused primary charged particle beam. Thus, if the charged signal particles are to be directed toward the detector, this poses some constraints on the possible deflection direction of the primary charged particle beam. For example, a range of possible deflection directions may be excluded.

It is, however, generally desired that the ion beam apparatus is adapted such that the beam can be tilted to impinge onto the specimen surface at any tilt angle that is within a given range. The apparatus may, in particular, be arranged such that the beam can be tilted, by applying a suitable voltage to the deflection electrode, to any tilt angle within a solid angle of 15 degrees around a given axis, whereby at each tilt angle the deflection voltage is such that the charged signal particles are drawn, by the deflection voltage, toward the detector. Typically the above axis is a normal to the specimen surface.

For this purpose, it is suggested tilting the primary charged particle beam with respect to a normal of the specimen surface, the tilting being substantially opposite to, or acting against, a deflection of the primary charged particle beam by the DC voltage. By substantially opposite, it is meant that at least one component of the tilt angle with respect to the normal of the specimen surface has an opposite sign to a corresponding component of an angle of the deflection direction with respect to the normal. Optionally, the tilting means are arranged for tilting the primary charged particle beam upstream, preferably directly upstream, of the post-focusing deflector arrangement with respect to a propagation direction of the primary charged particle beam. Thereby, the beam can enter the deflection region of the deflection electrode at a tilt angle. The tilt angle of the primary charged particle beam may thus compensate, or reduce, the subsequent deflection of the primary charged particle beam by the post-focusing deflection arrangement.

The tilting may be achieved by tilting the optical axis of the particle beam apparatus with respect to a normal of the specimen surface. Thus, either the optical axis can be tilted, or the specimen can be tilted. Alternatively, the normal of the specimen surface may be substantially parallel to the optical axis. In this case, the tilting may be achieved by constant deflecting, e.g., by the pre-focusing deflector arrangement, the primary charged particle beam such as that it is inclined with respect to the optical axis at a constant tilt angle when entering the deflection region of the post-focusing deflector arrangement. The primary charged particle beam tilted in this way generally traverses the focusing assembly at the same tilt angle. In order to reduce aberration effects, it is generally preferred that the tilted primary charged particle beam traverses the focusing assembly near the optical axis, e.g., closer to the optical axis than 200 µm, or even closer than 100 µm.

One embodiment is arranged such that, the primary beam impinges on the specimen at a tilt angle in the absence of a deflection effect, or force, or voltage, of the post-focusing deflector arrangement. Here, the tilt angle is defined as an angle with respect to a normal of a plane defined by the specimen surface, i.e., an angle being different from 90 degrees to the normal. Thereby, the beam can be tilted to any tilt angle within a solid angle while directing charged signal particles toward the detector. Thus, generally, at least a portion of a deflector arrangement is arranged between the optical axis and the detector such that the charged signal particles are directed toward the detector when the deflection arrangement is activated, e.g., set to a deflection voltage, according to normal operation.

The voltages applied to the electrodes of the post-focusing deflector arrangement can be symmetric. Alternatively, non-symmetrical voltages can be applied. By applying non-symmetrical voltages and by detecting the signal particles more information about the specimen can be obtained. This can be for instanced used to measure the electrical potentials on the specimen and to present them as a 'potential contrast' together with a representation of the specimen. Moreover, information regarding the material can be obtained.

In another embodiment, the ion beam apparatus (generally the charged particle beam apparatus) comprises at least two detectors. The detectors can be arranged opposite to each other while each detector is arranged behind a respective electrode of the post-focusing deflector arrangement and laterally with respect to the optical axis. The detectors can be arranged in the deflection plane of the post-focusing deflector arrangement. For example, when the post-focusing deflector arrangement comprises for instance two oppositely arranged electrodes, each of the electrodes may comprise a grid-like portion for allowing particles to pass therethrough. The detectors are then arranged behind the grid-like portions. If, on the other hand, the post-focusing deflector arrangement comprises an electrode arrangement with a plurality of elements, which form together respective electrodes, the detector can be arranged such to receive signal particles which passes through the clearance between the elements of the respective electrodes.

The arrangement of two or even more detectors provides for more flexibility with respect to the tilting of the ion beam (charged particle beam) and the gathering of information about the specimen. For instance, if two detectors are used, no fixed bias voltage is required and it is therefore possible to avoid tilting of the beam column and the optical axis. Further, two detector allows the simultaneous detection of (negative) secondary electrons and (positive) secondary ions or backscattered (positive) ions. In either case, a positive voltage is applied to one electrode while a negative voltage is applied to the opposite electrode. During operation, the polarity of the voltages applied will be inverted or alternated for tilting the primary ion beam.

On the other hand, it is also possible to apply voltages of the same polarity. In this case, both electrodes attract either positive or negative signal particles and both detectors are used to gather the respective information. Typically, voltages of same magnitude and same polarity are applied to the electrodes of the post-focusing deflector arrangement. In this case, the primary charged particle beam is not tilted. On the other hand, by applying voltages of same polarity but different magnitude to the electrodes of the post-focusing deflector arrangement it is also possible to tilt the primary charged particle beam.

Subsequently, concrete embodiments will be described in connection with the accompanying figures. In these embodiments, as above, the charged particle beam apparatus is mainly described in connection with an ion beam apparatus. However, as explained above, those skilled in the art will appreciate that the present invention is not restricted thereto but also includes e.g. electron beam apparatuses as well.

Figure 1:
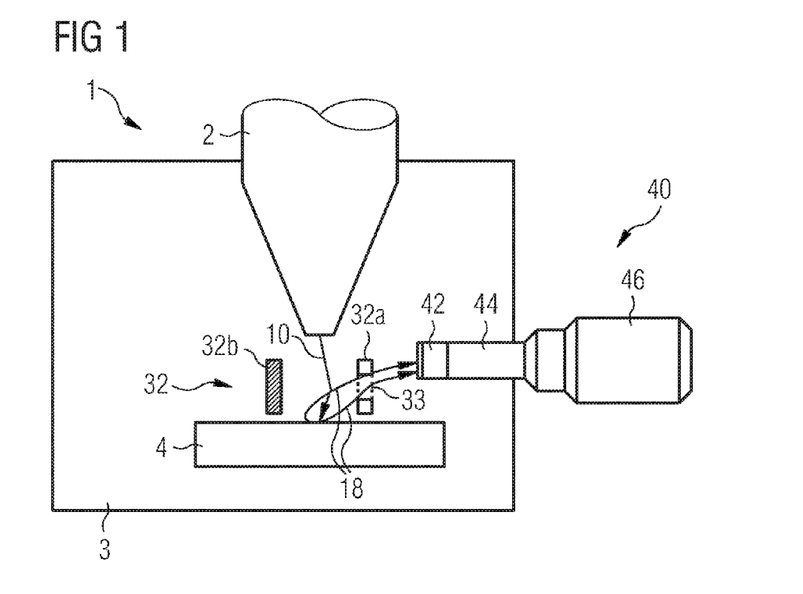
FIG. 1 shows a cross-sectional view of an ion beam apparatus having a deflector arrangement adapted for allowing charged signal particles passing therethrough.

FIG. 1 shows a cross-sectional view of an ion beam apparatus 1 during operation. The ion beam apparatus 1 comprises an ion beam column 2, a housing 3, a deflector 32 and a detection system 40 for charged signal particles. The housing 3 is evacuated. Further, there is a specimen 4 arranged within the housing 3. An ion beam 10 is generated by an ion source in the ion beam column 2 and is directed onto the specimen 4. The ion beam column 2 generally further comprises other common parts, particularly in focused ion beam devices, and that are not shown in FIG. 1. For example, electrodes are provided for accelerating the ion beam 10 and for directing it onto specimen 4. Further, an ion beam lens or similar focusing means are provided for focusing the ion beam onto the specimen. Further, the ion beam apparatus 1 can optionally comprise further deflectors such as the ones shown in FIGS. 6 and 7. The deflector 32 is located downstream, in a propagation direction of the charged particle beam 10, of the focusing means. The optional further deflectors are located upstream of the focusing means.

The deflector 32 preferably comprises at least two electrodes or deflector plates 32a and 32b. The charged particle beam 10 is deflected by applying a voltage to the electrodes 32a and 32b. Assuming that the ion beam 10 is formed by positively charged ions, in FIG. 1, a voltage difference is applied to the deflector plates 32a and 32b such that plate 32b is negatively charged (voltage −U), and that plate 32a is positively charged (voltage +U). The electrical field due to the voltage difference between the plates deflects the ions in the direction of plate 32b. The deflection system 32 may optionally comprise, in addition to the electrodes 32a and 32b, further electrodes. These further electrodes are, then, aligned in other directions than the electrodes 32a and 32b, e.g., in a direction orthogonal to the drawing plane of FIG. 1. These further electrodes allow then deflecting the ion beam 10 in the other directions.

When the ion beam impinges on the surface of the specimen 4, charged signal particles 18 are generated as a result of the interaction of the ion beam 10 with the specimen 4. As explained above, these charged signal particles may be e.g., secondary electrons or backscattered ions. The term "signal particles" indicates that at least some of these particles are subsequently detected, i.e., that they generate a detection signal in a detector. The detection signal may be used to gather information about the specimen 4, in particular about the interaction of the ion beam 10 with the specimen. The signal particles may be used, for example, for imaging the specimen in any focused ion beam microscopy application or for monitoring the status of a specimen manipulation such as ion milling or sputtering. In the following, the case will be discussed that the charged signal particles are secondary electrons. The case that the charged signal particles are other particles is, in principle, analogous.

The electrode 32a is adapted for allowing the secondary electrons 18 passing therethrough. Namely, it has a grid-like portion providing openings 33, through which at least some of the secondary electrons 18 can propagate. As shown in FIG. 1, the secondary electrons 18 can propagate, through the opening 33 defined by the electrode 32a, from the specimen 4 to the detector 40. The opening 33 thereby defines a propagation path for the secondary electrons from the specimen 4 to a detector 40.

The detector 40 comprises a scintillation plate 42, a light guide 44 and a photomultiplier tube 46. The scintillation plate 42 serves as a detection area. Namely, when one or more of the secondary electrons 18 hits the scintillation plate 42, a light signal is generated, i.e., photons are produced. The light signal then propagates along the light guide 44 to the photomultiplier tube 46 for detection. Thus, secondary electrons are detected by the detector 40. Any other known charged particle detector than the one shown in FIG. 1 may be used as a detector 40 in this and in any other embodiment of the invention.

The electrode 32a not only allows the secondary electrons 18 passing through its openings 33, but it is also arranged for directing the secondary electrons 18 toward the detector 40. Namely, if a positive voltage +U is applied to the electrode 32a, as it is the case in FIG. 1, the secondary electrons are attracted and thus directed toward the detector.

Thus, in the embodiment of FIG. 1, it is desired to apply a positive voltage to the electrode 32a (relative to the voltage of other electrodes, e.g., electrode 32b), such as to direct the secondary electrons 18 toward the detector 40. More generally, it is desired to apply a relative voltage to the electrode 32a that is of opposite sign than the charge of the signal particles. This poses some constraints on the deflection of the ion beam 10 by the deflector 32. In the embodiment of FIG. 1, for example, the ion beam 10 should be deflected away from the electrode 32a. Thus, the ion beam 10 can be tilted only in one direction.

The effect of directing the secondary electrons 18 toward the detector 40 and the effect of deflecting the ion beam 10 are linked, because both effects depend on the voltage applied to the electrode 32a. However, the directing of the secondary electrons 18 may further depends on the voltage applied to the electrode 32a relative to the voltage applied to the specimen 4, whereas the deflecting of the ion beam 10 depends mainly on the voltage applied to the electrode 32a relative to the voltage applied to the other electrode 32b. Therefore, if the voltage of the specimen is adjusted, the directing of the secondary electrons 18 may be controlled, to some degree, independently of the deflecting of the ion beam 10. Adjusting the specimen voltage 4 has a side effect in that it influences the incident energy of the ion beam 10 on the specimen 4.

FIG. 2 shows an ion beam apparatus having a fixes column tilt for compensating, or for acting against, a DC bias of the deflector 32. In this embodiment, the ion beam can be tilted, relative to the specimen surface, in both directions without need for adjusting a voltage applied to the specimen 4. The arrangement of the ion beam apparatus corresponds to that of FIG. 1, and like parts are assigned the same reference numbers.

In the ion beam apparatus of FIG. 2, the ion beam 10 impinges on the specimen 4 at a tilt angle in the absence of a voltage applied to the deflector 32. This is because the optical axis 20 is tilted relative to a normal 22 of the specimen surface. The optical axis 20 is defined by an axis of the beam column 2, more precisely by an axis of focusing means of the beam column (not shown). Alternatively, the ion beam may be tilted without tilting the optical axis relative to the normal 22. For example, the ion beam 10 may be deflected, by deflectors arranged upstream of the focusing means (not shown), onto a tilted path. An arrangement in which an ion lens 6 is not tilted according to a tilted path is, for example, illustrated in FIGS. 6 and 7, which is discussed in greater detail below. In this case, it is preferred that the ion beam traverses the focusing means close to a center of the focusing means.

Thus, the ion beam reaches the deflection region of the deflector 32 at a tilt angle (with respect to a normal of the specimen surface) that is opposite to the deflection direction of the deflector 32, i.e., to an angle between the deflection direction and a normal of the specimen surface.

Figure 2A:
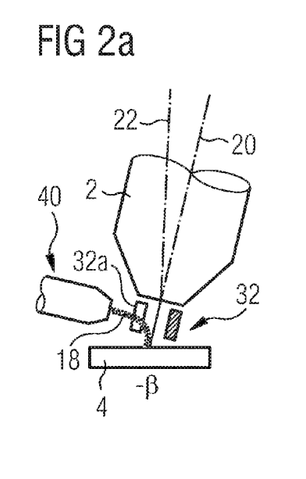
FIG. 2 shows a cross-sectional view of an ion beam apparatus, in which the ion beam is tilted in a region directly upstream of the post-focusing deflector arrangement.

In FIG. 2a, the ion beam 10 is shown while the deflector 32 is set to minimum deflection. Herein, the ion beam 10 impinges onto the specimen 4 at an angle $-\beta$. This angle is defined as the angle between the tangent of the ion beam 10 at or near the surface of the specimen 4 and the normal 22 of the specimen 4. If the deflection effect of the deflector 32 was completely absent, the angle $-\beta$ would be equal to the tilt angle. However, there must be some voltage applied to the electrodes of the deflector 32 if the signal electrons are to be directed to towards the detector. Consequently, the deflection of the ion beam 10 by the deflector 32 is not completely zero. The magnitude of the angle $-\beta$ is therefore somewhat smaller than the magnitude of the tilt angle. Nevertheless, because of the large mass difference between the ions of the ion beam 10 and the signal electrons 18, it is possible to direct the signal electrons toward the detector while having a negligible deflection of the ion beam 10. The magnitude of the angle $-\beta$ is therefore almost equal to the magnitude of the tilt angle. In most embodiments, the difference between $\beta$ and the magnitude of the tilt angle will be much less than 1 degree, e.g., less than 0.1 degree or even less than 0.02 degrees.

Figure 2B:
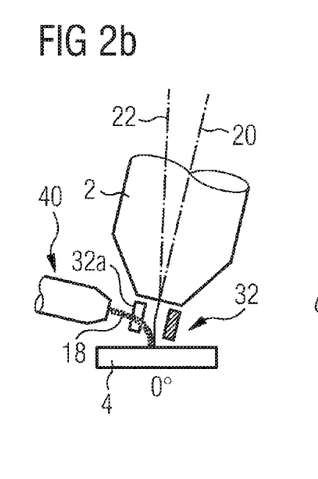
Figure 2C:
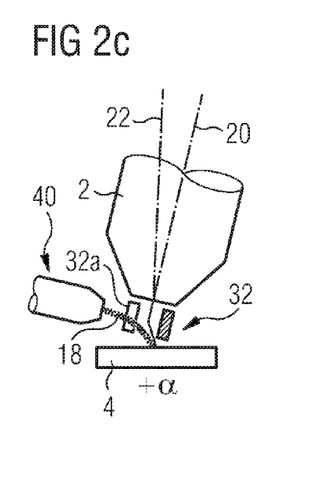

FIGS. 2b and 2c show the ion beam 10 when the deflector 32 is activated such that the signal electrons are directed toward the detector. In the present embodiment, this implies that a voltage is applied to the electrode 32a such that the signal electrons are directed toward the detector, i.e., a positive voltage is applied to the electrode 32a. In the ion beam apparatus, the optical axis is tilted such that when the deflector is activated as described above, the angle at which the primary beam strikes the specimen is changed in a direction that is substantially opposite to the tilt angle defined by the inclination of the optical axis with respect to the normal of the specimen surface. Since the tilt angle is negative, this means that the angle, at which the ion beam strikes the specimen or at least its angular component in the drawing plane of FIG. 2, is changed in a direction of positive angles.

FIG. 2b shows the ion beam 10, in which the voltage applied to the deflector 32 is chosen such that the incident angle of the ion beam 10 onto the specimen 4 is not tilted, i.e., equal to zero degrees. FIG. 2c shows the ion beam 10, in which the voltage applied to the deflector 32 is further increased, such that the incident angle becomes positive, namely equal to the positive angle $\alpha$. In the transition from FIG. 2a to FIG. 2b, and then from FIG. 2b to FIG. 2c, the angle at which the ion beam impinges on the specimen is thus further changed towards positive values. Thus, it can be said that in the transition from FIG. 2b to FIG. 2c the angle at which the ion beam impinges on the specimen is changed in a direction that is opposite to the tilt angle.

In this way, the beam apparatus 1 is adapted such that the beam 10 can be tilted to impinge onto the specimen 4 surface at a tilt angle within a range that includes negative and positive angles. In particular, the range includes angles between $-\beta$ and $\alpha$. A typical example for such a range is +/−15°. The tilting is performed while the electrode 32a having the opening 33 is set to positive voltages. More generally, the tilting is performed while the electrode 32a is set voltages within a range such as to draw the charged signal particles 18 toward the detector 40.

Figure 3:
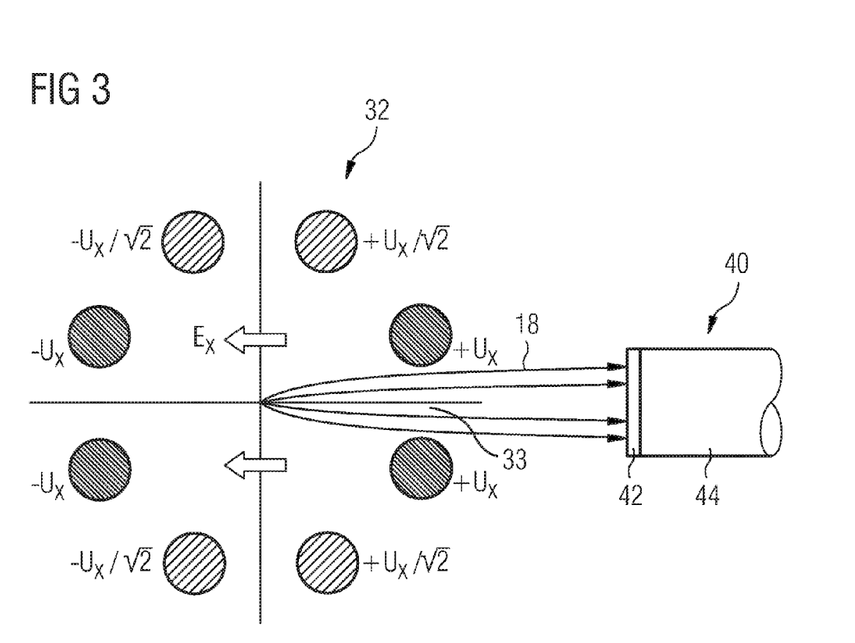
FIG. 3 shows a top view of a deflector arrangement that is adapted for allowing charged signal particles passing therethrough.

FIG. 3 shows a top cross-sectional view of a further deflector arrangement 32, i.e., a view in a plane orthogonal to the optical axis. The deflector arrangement can be used in place of the deflector arrangements shown in any of the other Figures.

The deflector arrangement 32 comprises eight electrode portions. The electrode portions are arranged in an equally spaced manner on a circle in a plane perpendicular to the optical axis. Respective pairs of the electrode portions are set to a given voltage. Namely, the rightmost pair is set to the voltage $+U_x$, two intermediate pairs are set to respective voltages $U_x/\sqrt{2}$ and $U_x/\sqrt{2}$, and the leftmost pair is set to the voltage $-U_x$. Other combinations of voltages may be applied. The chosen voltage combination shown in FIG. 2 has, together with the shown arrangement of the electrode portions, the effect of producing an approximately uniform electric field $E_x$ in a region defined by the electrode portions and thus of producing a well-defined beam deflection.

The two rightmost electrode portions are arranged for being set, during operation, to approximately the same voltage level. Therefore, the two rightmost electrode portions can be viewed as being a single electrode, even if they are not spatially or electrically connected. The two electrode portions define an opening 33 between them. The opening allows the signal electrons 18 passing therethrough. Further, the voltages applied in the deflector 32, notably the positive voltage $U_x$ applied to the rightmost electrode portions, has the effect of directing the signal electrons toward the detector. Thus, the function of the opening 33 between the electrode portions corresponds to that of the openings 33 in the grid-like portion of the electrode 32b shown in FIG. 1.

Being able to tilt the ion beam by a beam tilt arrangement such as the deflectors 32 of FIG. 1 to 3 can have a number of advantages. Possible advantages of a flexible beam control are illustrated in FIGS. 4 and 5.

For ion milling applications, it is often desired that the ion beam gives a cut perpendicular to a specimen surface. For example, if the ion beam is used for cutting a TEM lamella, the cuts should be coplanar, i.e., they should produce straight and parallel lamella surfaces. The TEM images of such specimens are easier to interpret than images e.g., from wedge shaped TEM lamellas or TEM samples.

Figure 4A:
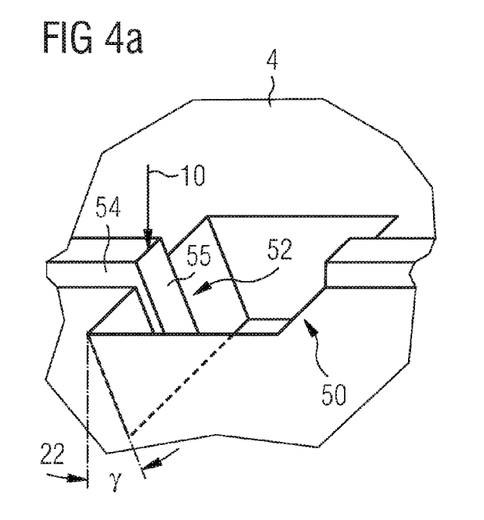
FIG. 4 shows a perspective view of an ion milling profile from an ion beam without tilted incident angle and related profile diagrams.

FIG. 4a shows a perspective view of an ion milling profile from an ion beam without tilted incident angle. Thus, the ion beam 10 is not tilted and impinges on the specimen 4 surface at a right angle. In other words, FIG. 4 shows a normal incidence of the ion beam. In this case, if a box is milled into the specimen 4, its sidewalls 52 will generally not be perpendicular to the specimen surface. In fact, at normal beam incidence, the cut that defines e.g., the sidewall 52 will be inclined by an angle γ with respect to the beam. The angle γ, i.e., the angle between the actual wall and the normal to the surface, is also called milling slope.

Figure 4B:
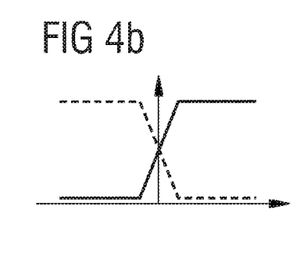
Figure 5:
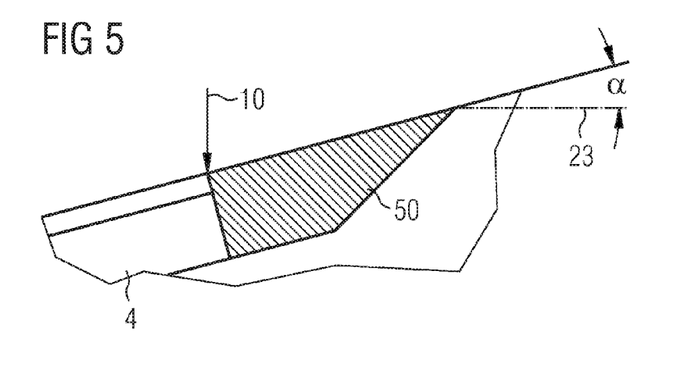
FIG. 5 shows a cross-sectional view of an ion milling profile from an ion beam with tilted incident angle.

FIG. 4b illustrates schematically an interpretation of the milling slope that is based on the so-called edge spread function. In FIG. 4b, it is assumed that an ion beam is scanned from x=0 (i.e., from the coordinate origin of the horizontal axis) to some positive x value outside the shown x range. FIG. 4b shows, as a solid line, the total charge distribution thereby deposited onto the specimen, as a function of x (in arbitrary units). The deposited charge distribution does not rise in a single discontinuous step at x=0, as one would expect for a perfectly focused ion beam. Instead, the step is smeared, such that the deposited charge distribution rises continuously and, to a first approximation, linearly, in a region around x=0. This is due to the spot size of the ion beam, or ion probe—e.g., because of imperfect focusing of the ion beam—and due to the scattering of the ions within the specimen. The milled profile is then approximately proportional to the deposited charge distribution. The dotted lines in FIG. 4b represent the resulting surface height of the specimen, i.e., an originally flat surface height minus the milled profile (in arbitrary units).

Further, FIG. 4a shows a cross section that is cut from a specimen 4, whereby the specimen 4 has a three-dimensional surface topography. Namely, the specimen surface has an elevated portion 54. In this case, the above-explained milling slope effect will lead to three-dimensional surface structures on the side wall 52 (namely, an elevated portion 55 corresponding to the elevated portion 54). In many applications, e.g., in TEM imaging, such topography will complicate interpretation of the structures that should be revealed by the cross section. This effect is also known as the curtaining effect.

Such complications can be avoided if a cross section perpendicular to the specimen surface, i.e., a normal cross-section, is achieved. A normal cross-section can, for example, be achieved by the arrangement shown in FIG. 5. Herein, the sample 4 is tilted with respect to the incident ion beam 10 by an angle α. More precisely, the sample surface is tilted with respect to a normal 23 to the optical axis by an angle α. This angle is essentially the same as the angle γ of FIG. 4, i.e., the milling slope angle. Then, a cross section normal to the specimen surface can be obtained. A cross section normal to the specimen surface is thus obtained by appropriately tilting the specimen 4 with respect to the incident ion beam 10.

Usually the angle of incidence of the ion beam 10 with respect to the specimen 4 is adjusted either by tilting a specimen stage or by tilting the ion beam column. Both of theses methods require complex mechanical design. For example, variable tilting the ion beam column is complicated because the tilting mechanism has to be vacuum-tight and the whole mechanism has to be stable enough to avoid vibrations that would affect the system performance. To tilt the specimen stage is especially complex for large specimen such as whole wafers. In this case even a small tilt will also require an additional z-movement for compensation. This may be necessary not only in order to align the specimen with the ion beam, but also because otherwise the stage might collide with parts of the system, e.g., with detectors.

The problems illustrated in FIGS. 4 and 5 can be avoided by providing one or more deflectors for tilting the ion beam. For example, the deflectors shown in FIGS. 1 to 3 may be used. Then, the beam tilt can be adjusted without mechanically tilting the beam column or the specimen. Further systems for controlling the ion beam tilt and other aspects of the ion beam, which are particularly flexible, are shown in FIG. 6 and FIG. 7.

Figure 6:
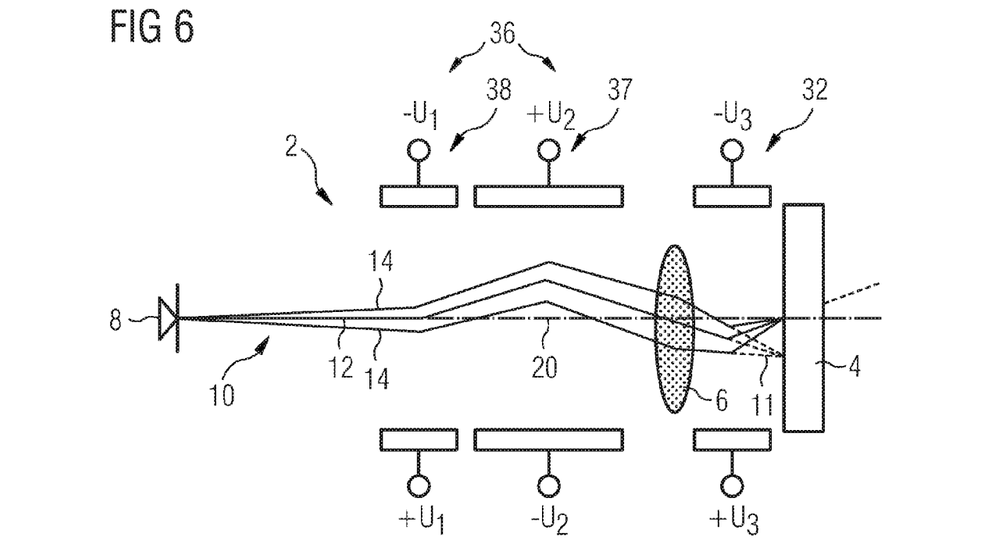
FIG. 6 shows a cross-sectional view of an ion beam apparatus having pre-focusing and post-focusing deflector arrangements tilting a charged particle beam.
Figure 7:
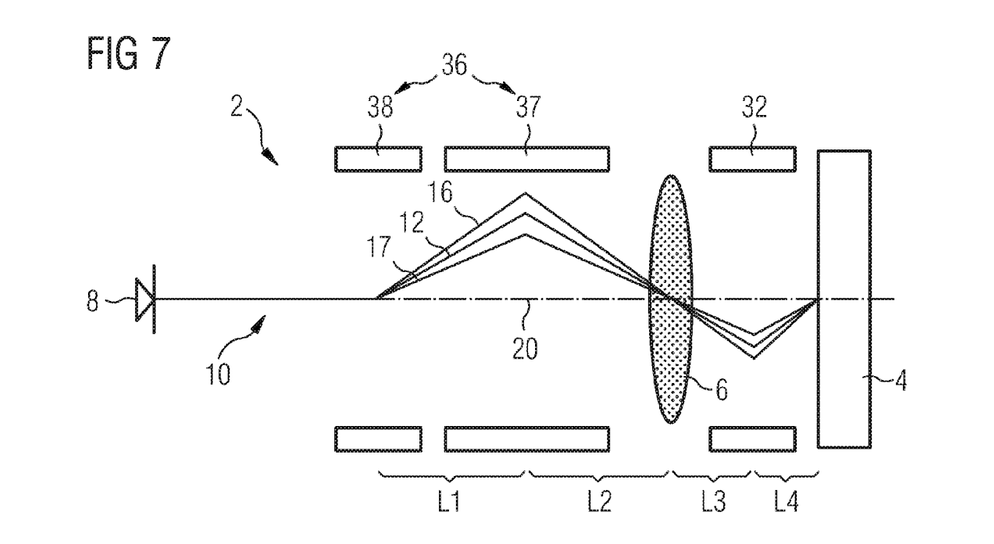
FIG. 7 shows a cross-sectional view of an ion beam apparatus having deflector arrangements as in FIG. 6, which tilt the charged particle beam and which are arranged for reducing a chromatic aberration.

FIG. 6 shows a cross-sectional view of an ion beam apparatus. Again, corresponding parts to those shown in FIGS. 1 to 3 are assigned the same reference numbers. The ion beam apparatus of FIG. 6 comprises beam column 2, with an ion source 8 and a focusing assembly 6 for focusing the charged particle beam 10. It is shown schematically in FIG. 6 that the focusing assembly 6 focuses diverging outer portions 14 of the ion beam 10 for convergence. Any known focusing assembly for focusing the ion beam 10 can be used. In the further description, an electrostatic lens is described by means of example for the focusing assembly 6. The ion beam column 2 further comprises multiple deflector arrangements 32, 36 for tilting the charged particle beam 10. The deflector arrangements comprise a set 36 of two pre-focusing deflectors 37, 38 arranged in front of the lens 6 and a post-focusing deflector 32 arranged behind the lens 6, in the propagation direction of the ion beam.

The two pre-focusing deflectors 37, 38 deflect the ion beam 10 in such a way that the principal portion 12 of the beam passes through the lens 6 close to the optical axis 20. This way, an optical aberration can be diminished. The dotted lines 11 depict the position of the focused ion beam if the post-focusing deflector 32 would not be activated, i.e., if no voltage was applied to the electrodes. Without the post lens deflector 32 being active, the ion beam 10 would impinge on the specimen surface at a position, indicated by the dotted lines 11, that is far off the optical axis. In other words, a focused ion probe would be formed at a position far off the optical axis. Thus, without the post-focusing deflector being active, the tilt angle and the probe position cannot be controlled independently. Consequently, a large mechanical shift in the specimen position would be required if the same portion of the specimen 4 is to be hit by the ion beam at different tilt angles. This would, in turn, require large movements of the specimen stage. In addition, the probe would be blurred due to a chromatic aberration of deflection by the deflectors 37, 38 and, in particular, due to a deflection coma.

The post lens tilt deflector 32 is arranged and controlled to deflect the ion beam 10, i.e., the converging bundle of rays 12, 14, back towards the optical axis 20. Therefore the beam 10 is incident on the sample 4 at a location very close to the optical axis. By this arrangement, the position and tilt angle of the ion beam 10 incident on the specimen 4 can be controlled independently, while assuring that the ion beam 10 traverses the lens 6 near the optical axis.

FIG. 7 shows a further cross-sectional view of an ion beam apparatus having a deflector arrangement for tilting a charged particle beam. Like parts are assigned like reference numbers with respect to FIG. 6. The deflectors 32, 36 of the ion beam apparatus of FIG. 7 are arranged and controlled such as to compensate a chromatic aberration of deflection and a deflection coma of the ion beam 10.

Namely, when the voltages or, more generally, the excitations of the deflectors 32, 36 are adjusted appropriately, the chromatic aberration (dispersion) of the deflector system 32, 36 can be reduced. It may even be possible to adjust the chromatic aberration to approximately zero.

Figure 8A:
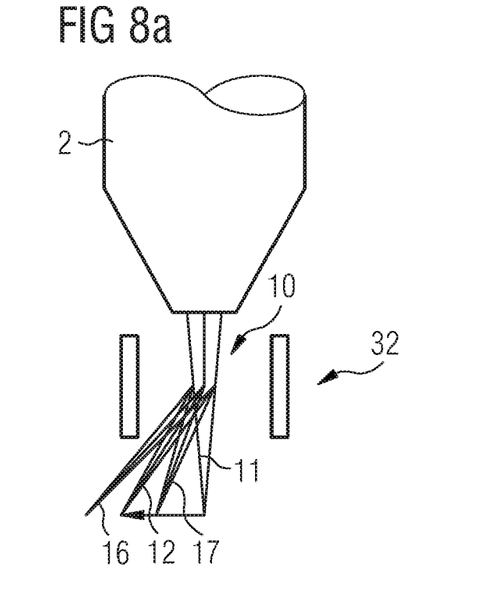
FIGS. 8a) to 8c) illustrate the chromatic aberration of a deflected charged particle beam.
Figure 8B:
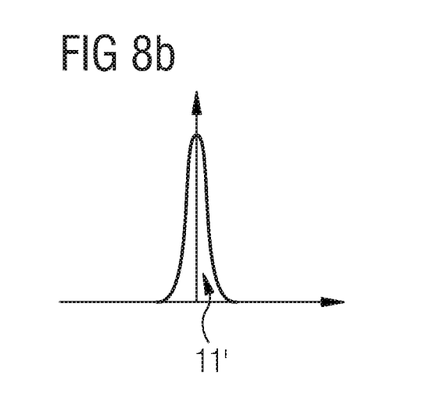
Figure 8C:
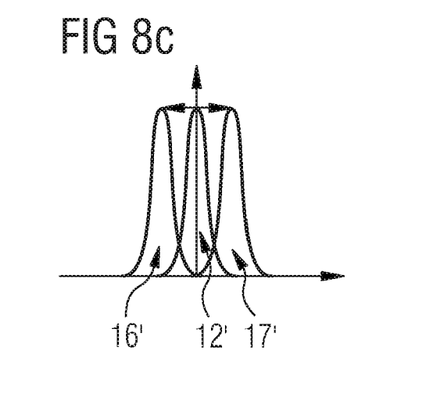

The chromatic aberration results from the fact that if the kinetic energy of the ions in the ion beam 10 is not uniform, then a high-energy portion 17 of the ion beam is deflected less than a low-energy portion 16. The chromatic aberration is illustrated in FIG. 8. Here, in FIG. 8a, without the deflector 32 being active, all portions of the ion beam 10, 11 follows an essentially straight propagation path and are not separated by energy, i.e., no chromatic aberration occurs. Thus, the beam intensity profile (intensity as a function of lateral displacement from the beam center) has the focused profile 11' of FIG. 8b. If, however, the deflector 32 is activated in FIG. 8a, a low-energy portion 16 of the beam is deflected more strongly than the principal (i.e., in this case, an average-energy) portion 12. Similarly, a high-energy portion 17 of the beam is deflected less strongly than the principal portion 12. The resulting intensity profile is shown in FIG. 8c. It is a superposition of three portions 16', 12' and 17' from the beam portions having different energies.

Returning to FIG. 7, if the deflectors are arranged appropriately, and if appropriate voltages are applied, it is possible to compensate the chromatic aberration of deflection. In particular, the following quantities may be chosen appropriately in order to reduce the chromatic aberration: The length L1 between the center of the deflector 38 and the center of the deflector 37; the length L2 between the center of the deflector 37 and the center of the lens 6; the length L3 between the center of the lens 6 and the center of the deflector 32; the length L4 between the center of the deflector 38 and the surface of the specimen 4; the voltages U32, U37 and U38 of the corresponding deflectors 32, 37 and 38. For example, the deflectors and the lens may be arranged such as to satisfy the relation L1=L2 and L3=L4; and the voltages may be chosen such as to satisfy U37=−2*U38, and U32=2*U38. Then, the ion beam traverses the principal plane of lens 6 and the plane defined by the specimen surface at or near the optical axis. Further, a chromatic aberration is reduced in these planes. Other similar setups can be easily achieved by the skilled person. A key element is that any positive chromatic aberration must be offset by a compensating negative chromatic aberration.

The voltage U32 and/or another one of the voltages may be modified by a small amount from the above setup. Then, the ion probe, or the location at which the ion beam is focused onto the specimen surface, is shifted off the axis to a small extent. Further, a small chromatic aberration is introduced. The small chromatic aberration can be chosen such as to reduce a defection coma due to the beam tilt. Thus, it is possible to set the defection coma to approximately zero. Thereby, it is possible to tilt the ion beam 10 and to adjust the angle of incidence without introducing additional image blur.

To align the beam tilt system correctly i.e., to compensate for the chromatic aberration of deflection and deflection coma, it is advantageous to adjust the voltages U32, U37 and U38 appropriately. Therefore a preferred embodiment has individual voltage supplies for each of the deflectors 32, 37 and 38.

The deflectors 37 and 38 of FIGS. 6 and 7 can, further, be used for scanning the ion beam 10 across the sample 4. The scan is performed by applying respective saw-tooth voltages to the pre-focusing deflectors 37 and 38. While the scan is performed, the beam may be tilted by applying a DC voltage to the post-focusing deflector 32. Then, further respective DC voltages are applied to the pre-focusing deflectors 37 and 38 in addition to the saw-tooth voltages for the scan. These further DC voltages are determined, by a voltage control, as a function of the beam tilt voltage, or vice versa. By determining the DC voltage of the pre-focusing deflectors 37 and 38 and the DC voltage of the post-focusing deflector 32 as a function of each other, a number of effects can be achieved. For example, a beam displacement due to the beam tilt can be reduced; a beam tilt can be adjusted independently of the scan; a beam tilt can be altered during the scan.

In the ion beam devices shown in FIGS. 6 and 7, secondary electrons may be generated. In order to detect the secondary electrons, it is advantageous to provide in the deflector 32 of the ion beam devices shown in FIGS. 6 and 7 an opening for allowing the secondary electrons passing therethrough. Further details regarding the deflector 32 may be implemented in analogy to the details given in FIG. 1 to 3 and the description thereof.

In the above embodiments, the deflectors, as well as the lenses, were described as electrostatic elements. However, magnetic elements may be used as well. Only if the deflector 32 is used for directing the secondary electrons to the detector, an electrostatic deflector should be used. Further, if the charged particle beam is an ion beam of ions having large masses, electrostatic elements are preferred due to their higher efficiency.

Figure 9A:
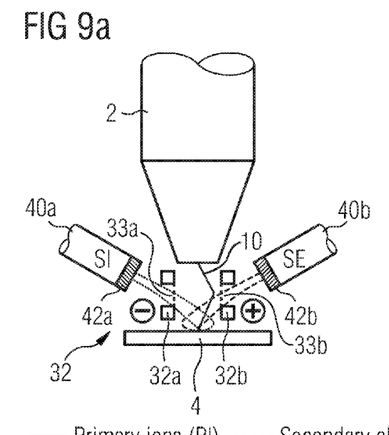
FIGS. 9a and 9b show an ion beam apparatus having two detectors and an inclined ion beam.
Figure 9B:
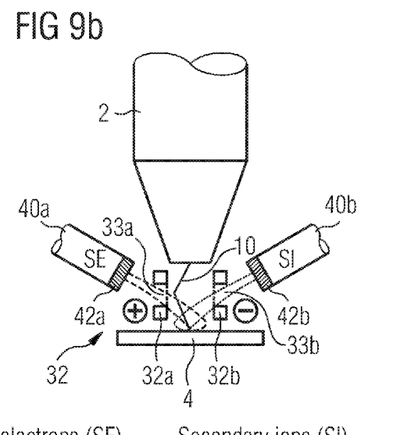

With reference to FIGS. 9a and 9b an ion beam apparatus having two oppositely arranged detectors 40a and 40b will now be described. In this configuration each of the electrodes 32a and 32b of the post-focusing deflector 32 comprises an opening or a grid-like portion 33a and 33b to allow charged particles, which are attracted by the respective electrodes, to pass therethrough and to propagate to the respective detectors 40a and 40b, each of which are arranged behind its assigned electrode. The path of the charged particles is indicated in FIGS. 9a and 9b wherein a solid line indicates the path of the primary ions (PI) (primary charged particles), a dotted line indicates the path of the secondary ions (SI) and a dashed line indicates the path of the secondary electrons (SE). Depending on the voltages applied to the respective electrodes 32a and 32b one detector is used for detecting secondary electrons and the other is used for detecting secondary ions. Which one of the detectors is used for secondary ions or secondary electrons, respectively, is indicated in FIGS. 9a and 9b by SE and SI, respectively. The polarity of the voltages applied to the respective electrodes 32a and 32b is indicated by the (+) and the (−) signs.

In FIGS. 9a and 9b the beam columns 2 are not tilted. By applying and inverting respective voltages to the electrodes negative and positive tilting angles of the primary ion beam 10 can be obtained (FIG. 9a: a negative tilting angle; FIG. 9b: a positive tilting angle). Hence, by inverting the applied voltages the primary ion beam 10 can be tilted from a negative to a positive tilting angle. Since two detectors are used, no constant 'bias voltage' is required to divert continuously the charged signal particles to a single detector arranged laterally with respect to the optical axis. By inverting the voltage applied to the electrodes 32a and 32b, the signal particles are alternatively attracted from the electrodes and hence, the detectors 'exchange' their function. If for instance only secondary electrons (SE) were to be detected, then the detectors alternatively detect the secondary electrons. If, on the other hand, secondary electrons (SE) and secondary ions (SI) are detected at the same time, then the detector, which had detected electrons, will now detect secondary ions and vice versa when the polarity of the applied voltages is inverted. These two 'states' are represented by FIGS. 9a and 9b, respectively. Hence, in either case a 'bias tilt' of the ion beam column is not required to compensate a constant bias voltage applied to the electrodes when using two detectors.

Figure 10A:
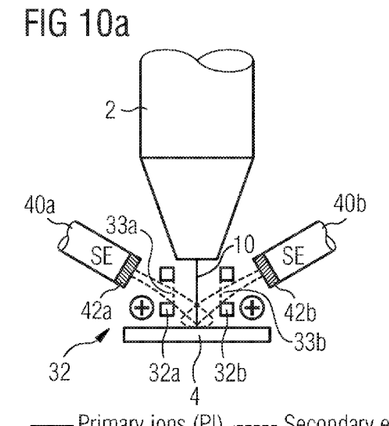
FIGS. 10a and 10b show an ion beam apparatus having two detectors and a non-inclined beam.
Figure 10B:
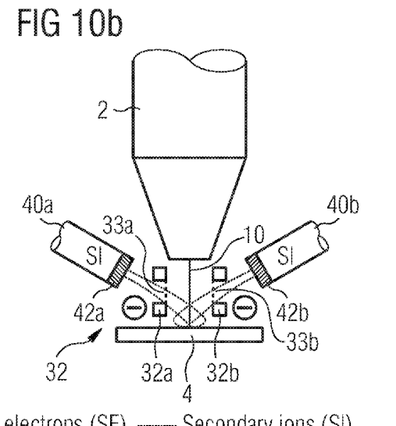

FIGS. 10a and 10b illustrate another embodiment comprising two detectors. The principal arrangement of the ion beam apparatuses shown in FIGS. 10a and 10b corresponds to that shown in FIGS. 9a and 9b and like reference signs indicate like parts. A substantial difference to the embodiment of FIGS. 9a and 9b is that either a positive (FIG. 10a) or a negative (FIG. 10b) voltage of same magnitude is applied to both electrodes 32a and 32b. Hence, both detectors 40a and 40b can either detect negatively charged signal particles such as secondary electrons (SE) as in FIG. 10a or positively charged signal particles such as secondary ions as in FIG. 10b. In either case, a tilting is not desired. Alternatively, the ion beam can be tilted by applying voltages of same polarity but different magnitude to the electrodes 32a and 32b.

It is worth mentioning that the scintillator material 42a and 42b of the respective detectors 40a and 40b can be adapted for their specific purposes of either detecting secondary electrons or secondary ions. It is, however, also conceivable to use the same material.

By detecting secondary ions additional information about the material of the specimen can be obtained. By appropriately representing this information, for instance as material contrast, valuable information can be provided for the operator.

The invention claimed is:

1. Charged particle beam apparatus comprising:
   a charged particle beam source for generating a primary charged particle beam;
   a focusing assembly configured for focusing the primary charged particle beam on a specimen, the focusing assembly defining an optical axis;
   a post-focusing deflector arrangement for deflecting the focused primary charged particle beam; and
   a detector for detecting charged signal particles which are emerging from the specimen upon interaction of the focused primary charged particle beam with the specimen, wherein
   the post-focusing deflector arrangement is arranged downstream of the focusing assembly with respect to the propagation direction of the primary charged particle beam, is adapted for allowing the charged signal particles passing therethrough, and is arranged for directing the charged signal particles towards the detector, and wherein; a deflection plane is defined in the vicinity of the specimen and the detector is laterally displaced from the optical axis in a region intersecting the deflection plane.

2. Charged particle beam apparatus according to claim 1, wherein the post-focusing deflector arrangement comprises an electrode that is adapted for allowing the charged signal particles passing therethrough.

3. Charged particle beam apparatus according to claim 1, wherein the detector is arranged, relative to the optical axis, outside the deflector arrangement.

4. Charged particle beam apparatus according to claim 1, wherein a detection portion of the detector is located on a downstream side of the focusing assembly with respect to the propagation direction of the primary charged particle beam.

5. Charged particle beam apparatus according to claim 1, wherein the deflector arrangement is arranged between the optical axis and the detector.

6. Charged particle beam apparatus according to claim 1, wherein the post-focusing deflector arrangement comprises a grid-like portion for allowing the charged signal particles passing therethrough.

7. Charged particle beam apparatus according to claim 1, wherein the post-focusing deflector arrangement comprises at least two elements defining an opening therebetween for allowing the signal particles passing therethrough.

8. Charged particle beam apparatus according to claim 1, further comprising a voltage supply for supplying a DC voltage to the electrode or to the post-focusing deflector arrangement for directing the charged signal particles towards the detector and for deflecting the focused primary charged particle beam.

9. Charged particle beam apparatus according to claim 8, further comprising tilting means for tilting the primary charged particle beam with respect to a normal of the specimen surface, the tilting means being arranged such that the tilting is substantially opposite to a deflection of the primary charged particle beam by the DC voltage.

10. Charged particle beam apparatus according to claim 9, wherein the tilting means are arranged for tilting the primary charged particle beam upstream of the post-focusing deflector arrangement with respect to a propagation direction of the primary charged particle beam.

11. Charged particle beam apparatus according to claim 9, wherein the means for tilting the primary charged particle beam is a tilted optical axis of the particle beam apparatus with respect to a normal of the specimen surface.

12. Charged particle beam apparatus according to claim 1, further comprising a pre-focusing deflector arrangement arranged upstream of the focusing assembly with respect to the propagation direction of the primary charged particle beam, and a control unit for controlling the pre-focusing deflector arrangement.

13. Charged particle beam apparatus according to claim 12, wherein the control unit is arranged for controlling the pre-focusing deflector arrangement to deflect the primary charged particle beam, such that the primary charged particle beam traverses the focusing means substantially at a center of the focusing means and at a pre-focusing tilt angle with respect to the optical axis.

14. Charged particle beam apparatus according to claim 13, wherein the control unit is further adapted for controlling the post-focusing deflector arrangement to deflect the beam substantially opposite to the pre-focusing tilt angle.

15. Charged particle beam apparatus according to claim 12, wherein the pre-focusing deflector arrangement comprises at least two independently controllable deflection units.

16. Charged particle beam apparatus according to claim 12, wherein the control unit is further adapted for controlling the pre-focusing deflector arrangement and the post-focusing deflector arrangement to deflect the primary charged particle beam such that a chromatic aberration of the primary charged particle beam caused by the pre-focusing deflector arrangement is reduced by the post-focusing deflector arrangement.

17. Charged particle beam apparatus according to claim 12, wherein the pre-focusing deflector arrangement is further operable for scanning the charged particle beam over the specimen.

18. Charged particle beam apparatus according to claim 12, wherein the control unit is adapted for
supplying a first DC voltage to the post-focusing deflector arrangement and for supplying a saw-tooth voltage with a superimposed second DC voltage to at least a part of the pre-focusing deflector arrangement, and wherein
the control unit comprises means for determining the first DC voltage and the second DC voltage as a function of each other.

19. Charged particle beam apparatus according to claim 1, further comprising at least a further detector.

20. Charged particle beam apparatus according to claim 19, wherein the detectors are arranged at opposite positions with respect to the optical axis.

21. Charged particle beam apparatus according to claim 19, wherein each of the detectors is arranged behind respective electrodes of the post-focusing deflector arrangement with respect to the optical axis.

22. Method for operating a charged particle beam apparatus, the method comprising the steps of:
providing a specimen;
generating a primary charged particle beam;
focusing the primary charged particle beam onto the specimen by a focusing assembly, the focusing assembly defining an optical axis;
deflecting, by a post-focusing deflector arrangement, the focused primary charged particle beam downstream of the focusing assembly with respect to the propagation direction of the primary charged particle beam;
directing, by the post-focusing deflector arrangement, charged signal particles, which are emerging from the specimen upon interaction of the focused primary charged particle beam with the specimen, towards a detector;
wherein a deflection plane is defined in the vicinity of the specimen, and the detector is laterally displaced from the optical axis in a region intersecting the deflection plane; and
detecting, by the detector, the charged signal particles.

23. Method for operating a charged particle beam apparatus according to claim 22, wherein the step of deflecting is performed by applying a first DC voltage to the post-focusing deflector arrangement, the method further comprising the step of:
scanning the charged particle beam over the specimen by applying a voltage to at least one scanning deflector, the voltage being an AC voltage superimposed by a second DC voltage determined from the first DC voltage.

24. Method for operating a charged particle beam apparatus according to claim 22, wherein the step of deflecting includes deflecting the primary charged particle beam in a dispersive manner such as to reduce a chromatic aberration of the primary charged particle beam.

* * * * *